US008681028B2

(12) United States Patent
Terazawa

(10) Patent No.: US 8,681,028 B2
(45) Date of Patent: Mar. 25, 2014

(54) ANALOG TO DIGITAL CONVERTER PROVIDED WITH PULSE DELAY CIRCUIT

(71) Applicant: DENSO CORPORATION, Kariya (JP)

(72) Inventor: Tomohito Terazawa, Okazaki (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/622,437

(22) Filed: Sep. 19, 2012

(65) Prior Publication Data

US 2013/0249722 A1     Sep. 26, 2013

(30) Foreign Application Priority Data

Sep. 20, 2011   (JP) ................................. 2011-204712

(51) Int. Cl.
*H03M 1/10* (2006.01)
(52) U.S. Cl.
USPC ............. 341/120; 367/124; 367/98; 341/136; 341/155; 341/142; 341/122; 341/138
(58) Field of Classification Search
USPC .............................. 367/98–124; 341/120–155
See application file for complete search history.

(56) References Cited

U.S. PATENT DOCUMENTS

| 5,396,247 | A | 3/1995 | Watanabe et al. | |
| 6,771,202 | B2 * | 8/2004 | Watanabe et al. | 341/155 |
| 6,879,278 | B2 * | 4/2005 | Watanabe et al. | 341/155 |
| 7,123,547 | B2 * | 10/2006 | Szajnowski | 367/124 |
| 7,268,719 | B2 * | 9/2007 | Terazawa et al. | 341/157 |
| 7,755,530 | B2 * | 7/2010 | Terazawa et al. | 341/157 |
| 2003/0174082 | A1 | 9/2003 | Honda | |
| 2008/0309542 | A1 | 12/2008 | Tanizawa | |

FOREIGN PATENT DOCUMENTS

| JP | 05-259907 A | 10/1993 |
| JP | 2003-273735 A | 9/2003 |
| JP | 2008-312185 A | 12/2008 |

OTHER PUBLICATIONS

Office Action mailed Oct. 15, 2013 in corresponding JP Application No. 2011-204712 (and English translation).

* cited by examiner

*Primary Examiner* — Lam T Mai
(74) *Attorney, Agent, or Firm* — Posz Law Group, PLC

(57) ABSTRACT

An analog to digital converter includes: a first pulse delay circuit forming a multi-stage delay unit of which each delay unit have a pulse signal delayed with a delay time responding to an input voltage; a first encoding circuit that detects the number of delay units in the first pulse delay circuit through which the pulse signal passes during a predetermined measurement period, and outputs the AD conversion data based on the number of delay units; and a timing generation circuit which, in response to receiving the start signal, generates an end signal when the input voltage of the first pulse delay circuit is a specified voltage within an allowable input voltage range, in order to determine the measurement period which is a time required for the pulse signal to pass through a predetermined number of the delay units which is specified in advance.

9 Claims, 13 Drawing Sheets

US 8,681,028 B2

ANALOG TO DIGITAL CONVERTER PROVIDED WITH PULSE DELAY CIRCUIT

CROSS REFERENCE TO RELATED APPLICATION

This application is based on and claims the benefit of priority from earlier Japanese Patent Application No. 2011-204712 filed on Sep. 20, 2011 the description of which is incorporated herein by reference.

BACKGROUND

1. Technical Field

The present disclosure relates to analog to digital converters, and more particularly to an analog to digital converter provided with a pulse delay circuit including a plurality of delay units connected with each other, in order to perform an analog to digital conversion.

2. Description of the Related Art

A type of analog to digital converter utilizes the pulse delay circuit for the analog to digital conversion in which each delay unit delays a pulse signal with a delay time corresponding to an input voltage.

Conventionally, this type of analog to digital converter is known as a Time Analog to Digital converter, i.e., TAD, that is constituted by digital circuit, and the TAD enables fast analog to digital conversion.

As an example of the TAD, Japanese Patent Application Laid-Open Publication No. 1993-259907 discloses a TAD having the following configuration. FIG. 1 is a block diagram showing a configuration of the TAD disclosed in the above-described patent document.

As shown in FIG. 1, the TAD 10 is provided with a ring delay line 11 (hereinafter is called as RDL 11) in which a plurality of delay units are electrically connected with each other in the form of a ring shape. The TAD 10 is configured to delay a pulse signal by a delay time corresponding to an analog input voltage Vin. The delay unit included in the RDL 11 is constituted by a NAND circuit (as first stage of the RDL 11) and a plurality of inverter circuit INVs (the number of inverter circuits is even number). The NAND circuit receives a pulse signal PA at an input terminal of the RDL 11 and the plurality of inverter circuits INVs is configured to invert the pulse signal and output the inverted pulse signal.

The TAD 10 includes a counter 12, a latch circuit 13, a pulse selector 14, an encoder 15 and a signal processing circuit 16. The counter 12 counts the number of times the pulse signal circulates in the RDL 11 by counting the number of inversions of the output level at the last-stage delay unit in the RDL 11 and generates a numerical data. The latch circuit 13 latches the numerical data generated by the counter 12 at a measurement timing indicated by a pulse signal PB. The pulse selector 14 is configured to acquire the output of the delay unit that constitutes the RDL 11 at the measurement timing of the pulse signal PB, determine the output level so as to extract a pulse signal that circulates in the RDL 11 and generate a signal indicating the location where the pulse signal is circulating in the RDL 11. The encoder 15 generates numerical data corresponding to the output signal from the pulse selector 14. The signal processing circuit 16 is configured to receive the numerical data from the latch circuit 13 and the encoder 15 such that the numerical data outputted by the latch circuit 13 as upper bits and the numerical data outputted by the encoder 15 as lower bits are inputted to the signal processing circuit 16, and add the upper bits and the lower bits whereby the signal processing circuit 16 generates numerical data DT indicating the number of delay units (NAND, INV) where the pulse signal passes through within a predetermined period defined by the period of pulse signal PB.

The pulse signal PA and PB is supplied by external control circuit and the TAD 10 converts the analog input voltage Vin during a period from the pulse signal PA is inputted to the TAD to the pulse signal PB is inputted to the TAD, and outputs AD conversion data DT which corresponds to average value of the input voltage Vin averaged during the above-described period.

Since the delay time at the delay unit (NAND circuit and INV circuit) has a temperature dependency, the delay time does not vary only depending on the input voltage Vin but also varies depending on the temperature. Generally, the higher the temperature, the larger the delay time. Hence, input-output characteristics of the TAD 10 (i.e., conversion characteristics between input voltage Vin and AD conversion data DT) have temperature dependency as well.

FIG. 2 is a graph showing an example of a measurement result for the input-output characteristics at the temperatures −40 degree C., 0 degree C. and 100 degree C. As shown in FIG. 2, in the input-output characteristics, a point where the input-output characteristics are constant regardless of the temperature, exists. Hereinafter the point where the input voltage Vin has no temperature dependency is called no temperature dependency voltage Vf (i.e., temperature independent voltage Vf).

A fluctuation in the AD conversion data DT due to temperature variation is extremely low around the temperature independent voltage Vf and the fluctuation becomes larger when the input voltage Vin moves apart from the temperature independent voltage Vf. That is to say, when the input voltage Vin fluctuates around the temperature independent voltage Vf, influence of the temperature variation can be suppressed.

The temperature independent voltage Vf can be designed to be within a given voltage range by controlling a process parameter in the manufacturing process, e.g. CMOS process, such as threshold voltage of MOS transistors in the delay unit. However, at the moment, the temperature independent voltage is difficult to control to the desired voltage value by using the adjustable process parameters.

SUMMARY

An embodiment provides an analog to digital converter (AD converter) capable of suppressing fluctuation in the analog to digital conversion data due to temperature characteristics of the delay unit included in the analog to digital converter.

The AD converter according to the embodiment includes a first pulse delay circuit having a multi-stage delay unit in which each delay unit delays a pulse signal with a delay time responding to an input voltage and a first encoding circuit. The first encoding circuit receives a start signal and an end signal, detects the number of delay units through which the pulse signal passes in the first pulse delay circuit during a measurement period determined by the start signal indicating the start of the period and the end signal indicating the end of the period, and outputs AD conversion data representing a numerical data based on the number of delay units.

At this time, in response to receiving the start signal, a timing generation circuit generates an end signal when the input voltage of the first pulse delay circuit is a specified voltage within an allowable input voltage range, in order to determine the measurement period, i.e., a time required for the pulse signal to pass through a number of delay units which is specified in advance.

Here, the number of delay units is N, the delay time of the delay unit at the temperature Tm1 is D, the delay time of the delay unit at the temperature Tm2 is D+ΔD. In this case, according to the present disclosure, a measurement period TW (Tm1) at the temperature Tm1 is expressed by the equation (1), and a measurement period TW (TW2) at the temperature Tm2 is expressed by the equation (2).

$$TW(Tm1)=N \times D \qquad (1)$$

$$TW(Tm2)=N \times (D+\Delta D) \qquad (2)$$

It is assumed the input voltage equals the specified voltage as follows.

Assuming the measurement period is constant like a measurement period in conventionally used apparatus, the AD conversion data DT being outputted by the first encoding circuit is expressed by the equation (3) when the temperature is Tm1 and expressed by the equation (4) when the temperature is Tm2. Therefore, the values of the AD conversion data are different depending on the temperature. It is noted that the measurement period TW is represented as TW=N×D $$DT(Tm1)=TW/D=N \qquad (3)$$

$$DT(Tm2)=TW/(D+\Delta D) \neq N \qquad (4)$$

However, in the AD converter according the present disclosure, when the measurement period is changed depending on the temperature, the AD conversion data DT outputted by the first encoding circuit is expressed by the equation (5) when the temperature is Tm 1 and expressed by the equation (6) when the temperature is Tm 2. Therefore, the same AD conversion data can be obtained regardless of the temperature variation.

$$DT(Tm1)=TW(Tm1)/D=N \qquad (5)$$

$$DT(Tm2)=TW(Tm2)/(D+\Delta D)=N \qquad (6)$$

Thus, according to the AD converter of the present disclosure, when the input voltage is the specified voltage, the AD converter data does not depend on the temperature. Hence, a voltage without temperature dependency (i.e., temperature independent voltage) can readily be produced.

As a result, by setting the specified voltage to be a center value within the voltage range where the input voltage varies, fluctuation in the AD conversion data due to the temperature characteristics of the delay unit can be suppressed. In the AD converter according to the present disclosure, for example, the timing generation circuit may include a second pulse delay circuit and a selector circuit. The second pulse delay circuit is constituted by a plurality of delay units mutually connected to form a multi-stage delay unit. Each delay unit included in the multi-stage delay unit is configured to have a pulse signal delayed with a delay time responding to the specified voltage, and each delay unit has substantially the same temperature dependency as the delay unit included in the first pulse delay circuit. The selector circuit is configured to select an output of a delay unit where the pulse signal has passed through the number of delay units specified in advance, and output the output of the delay unit as the end signal.

The temperature dependency (characteristics) of the delay unit included in the first pulse delay circuit and the delay unit included in the second pulse delay circuit can have substantially the same characteristics easily, for example, by integrating both delay circuits into the same semiconductor integrated circuit chip.

As described above, according to the AD converter of the present disclosure, the temperature independent voltage can be controlled by using the specified voltage. However, the further apart the input voltage from the temperature independent voltage, the larger the error of the AD conversion data. Therefore, if the input voltage varies significantly within a relatively large voltage range, fluctuation in the AD conversion data due to temperature change cannot be suppressed completely.

Accordingly, the AD converter of the present disclosure includes a second encoding circuit that detects the number of delay units in the second pulse delay circuit through which the pulse signal passes during a predetermined fixed period, the second encoding circuit outputting temperature data that correlates to a temperature, based on the number of delay units detected thereby; and a calibration circuit that calibrates the AD conversion data outputted by the first encoding circuit. The calibration circuit calibrates the AD conversion data by using the temperature data outputted by the second encoding circuit, predetermined reference temperature data which is temperature data outputted by the second encoding circuit when the temperature is a predetermined reference temperature and predetermined reference AD conversion data which is AD conversion data outputted by the first encoding circuit when the input voltage is the specified voltage, and outputs a value which would be output when the temperature is the reference temperature.

In other words, when the delay time of the delay unit varies due to temperature change, the number of delay units through which the pulse signal passes in the predetermined fixed period, that is, the temperature data outputted by the second encoding circuit varies as well.

Therefore, when the amount of change of the temperature data from the reference temperature data is determined, the current temperature (i.e., delay time of the delay unit) can be estimated. Then, based on the estimated current temperature, the AD conversion data is calibrated. As a result, an accurate AD conversion data with less temperature errors can be obtained.

Moreover, errors of the temperature characteristics can be improved over the entire input voltage range. Even though the AD conversion data represents an amount of input voltage, the AD conversion data does not represent directly the absolute value of the input voltage. When the AD conversion data is used for various controls, it is necessary to convert the AD conversion data to voltage values. The voltage value can be obtained after calibrating the AD conversion data by the above-described calibration circuit, or the voltage value can be obtained directly from the AD conversion data outputted by the first encoding circuit without calibrating the AD conversion data.

Specifically, in this case, as an input voltage to the first pulse delay circuit, the input selector circuit supplies the target voltage to be converted and the reference voltage which is different from the specified voltage to the first pulse delay circuit alternately. The voltage calculation circuit calculates the target voltage by using a predetermined reference AD conversion data which is AD conversion data outputted by the first encoding circuit when the input voltage is the specified voltage, the AD conversion data outputted by the first encoding circuit when the target voltage is supplied to the first encoding circuit by the input selector circuit, and the AD conversion data outputted by the first encoding circuit when the reference voltage is set to be the specified voltage.

In fact, since the input-output characteristics when the AD conversion data is obtained from the reference voltage are estimated by using the AD conversion data of the specified voltage and the AD conversion data of the reference voltage, the voltage value can be obtained from the AD conversion data of the target voltage by using the estimated input-output characteristics. Thus, in the AD converter as described above, a voltage value where influence of the temperature is eliminated can be obtained without using AD conversion data calibrated by the calibration circuit.

Further, the AD converter according to the present disclosure may include a plurality of unit circuits, each unit circuit being configured by any one of the above-described AD converters and an adder that adds outputs of the plurality of unit circuits. The analog to digital converter outputs an output of the adder to be an AD conversion data.

In this case, the larger the number of unit circuits, the more the resolution of the AD conversion is enhanced.

DETAILED DESCRIPTION OF THE PREFERRED EMBODIMENTS

With reference to drawings, hereinafter are described embodiments of the present disclosure.

First Embodiment

With reference to FIGS. 3, 4A, 4B and 5, first embodiment of the present disclosure is described herein below.

Figure 3:
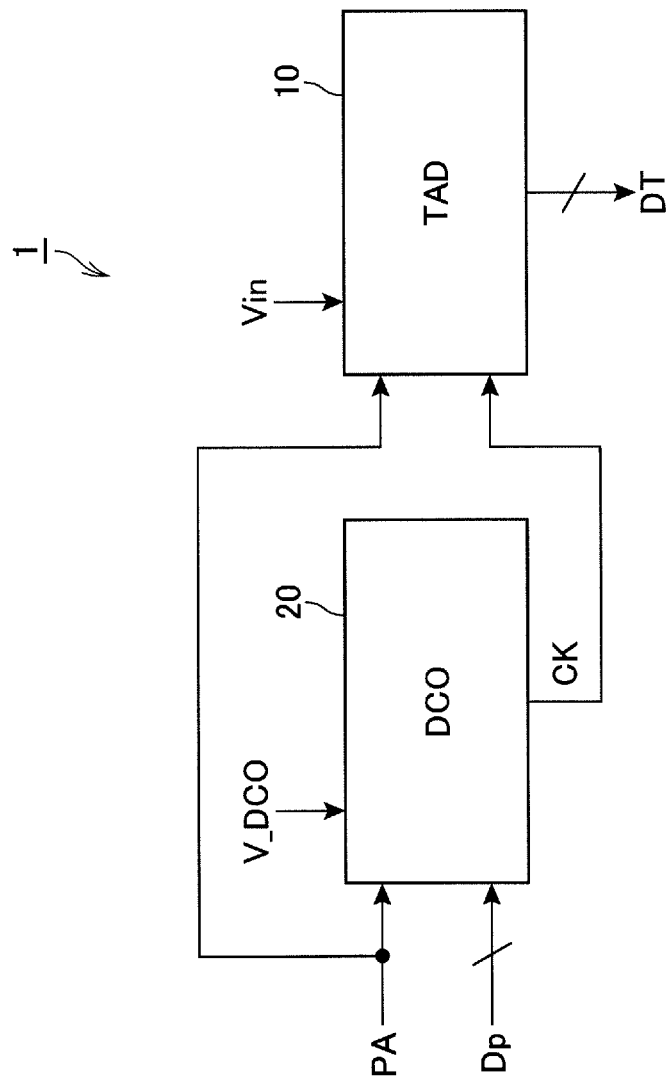
FIG. 3 is a block diagram showing an overall configuration of an analog to digital converter according to the first embodiment of the present disclosure.

FIG. 3 is a block diagram showing an overall configuration of an analog to digital converter 1 (AD converter 1).

As shown in FIG. 3, the AD converter 1 includes a TAD 10 and a digitally controlled oscillator (DCO) 20 which are integrated in the same semiconductor IC device. The TAD 10 starts operation triggered by the pulse signal PA when the pulse signal PA is high level and generates, at a timing of the sampling clock CK, a numeric data DT (AD conversion data) which responds to the input voltage Vin. The DCO 20 operates when the pulse signal PA is high level and generates a sampling clock CK having a period defined by a period data Dp.

Figure 1:
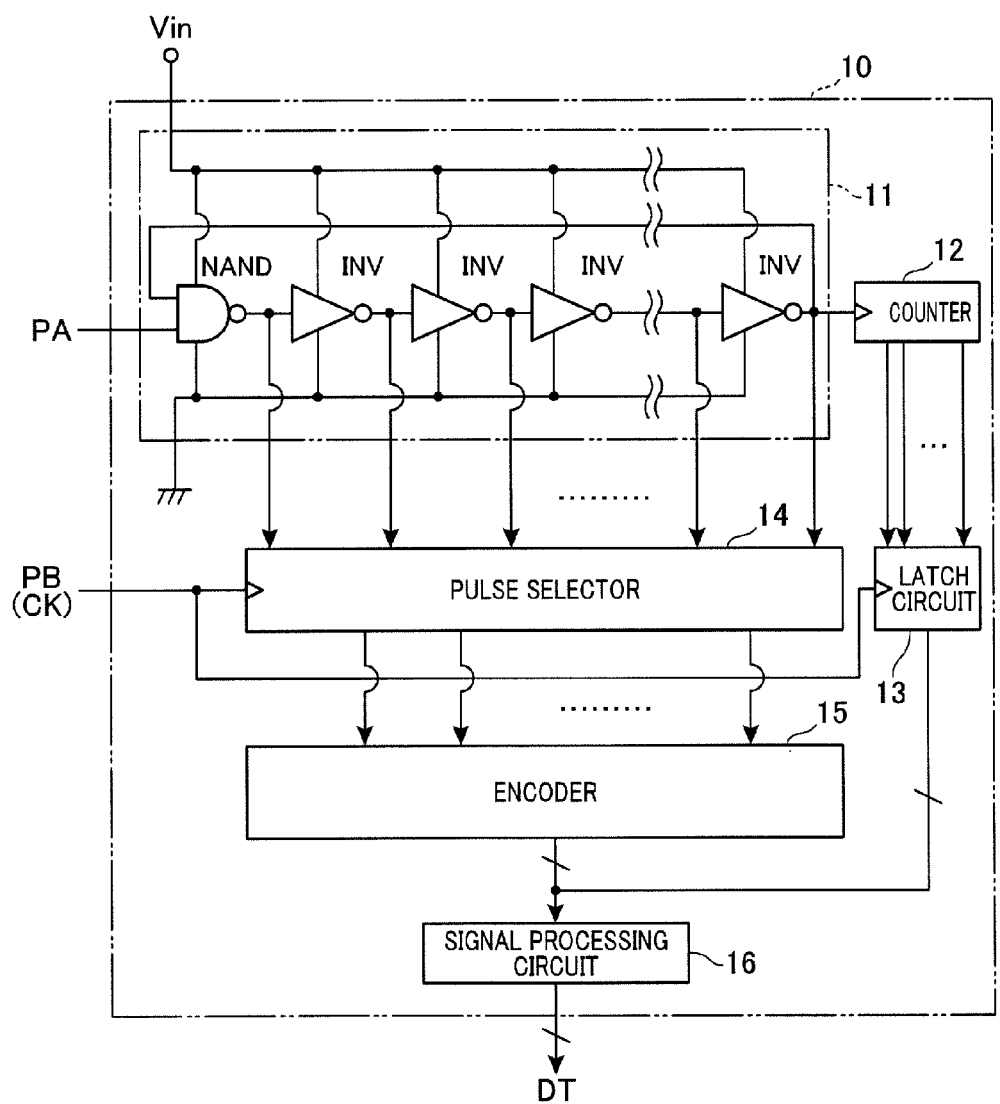
FIG. 1 is a block diagram showing a configuration of a time analog to digital converter circuit (TAD)
Figure 2:
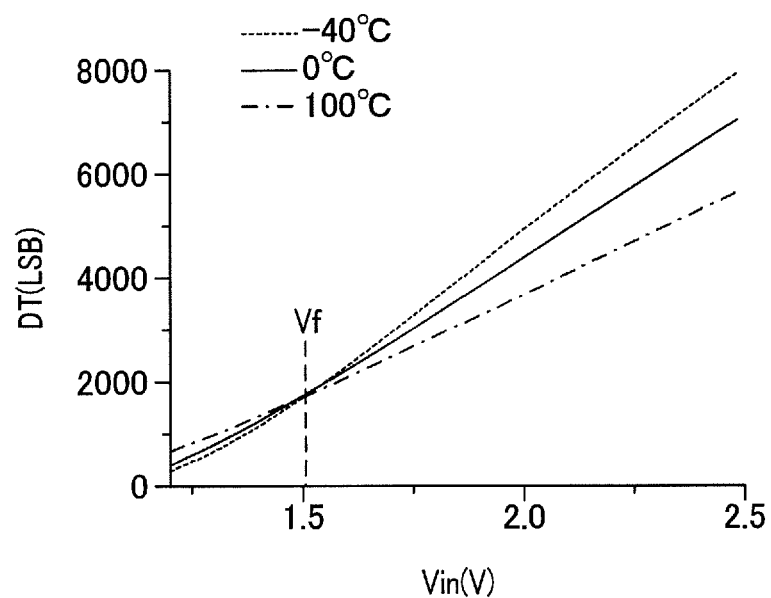
FIG. 2 is a graph showing input-output characteristics of the TAD.

Regarding the TAD 10, instead of using the pulse signal PB that indicates a measurement timing, a sampling clock CK is used. However, the other configuration used for the TAD 10 is similar to that of the conventionally used time analog to digital converter as shown in FIG. 1. Hence, the explanation of the TAD 10 is omitted.

Figure 4A:
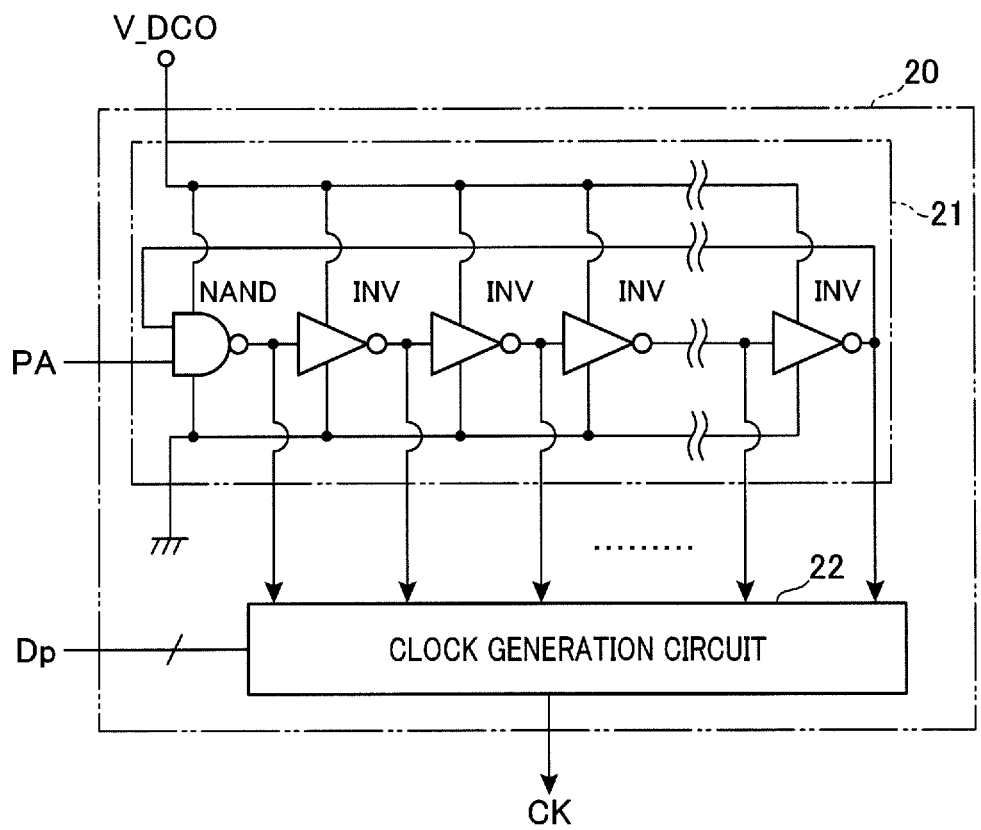
FIG. 4A is a block diagram showing an overall configuration of a digitally controlled oscillator. i.e., DCO.
Figure 4B:
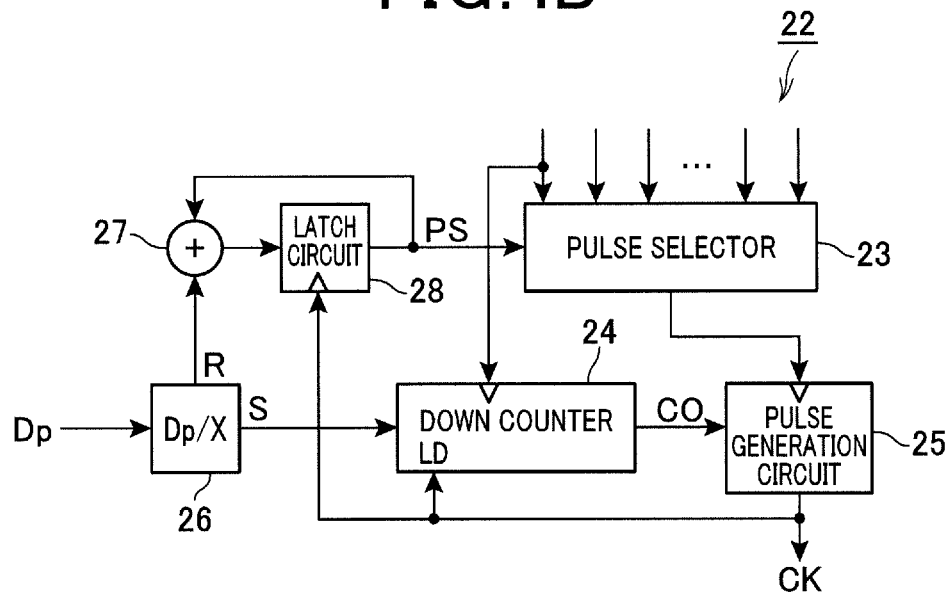
FIG. 4B is a block diagram showing a clock generation circuit included in the DCO.

FIGS. 4A and 4B are block diagrams showing a configuration of the DCO 20. FIG. 4A is a block diagram showing an overall configuration of the DCO 20 (including a circuit diagram). FIG. 4B is a block diagram showing a configuration of a clock generation circuit included in the DCO 20. As shown in FIG. 4A, the DCO 20 includes a negative logical AND circuit (NAND circuit), a ring delay line 21 (i.e., RDL: pulse delay circuit) constituted by a plurality of inverters INVs (the number of INVs is even number), and a clock generation circuit 22 that generates a sampling clock CK. The NAND circuit operates in response to a pulse signal PA received at one terminal of the NAND circuit. Each of the inverters INVs inverts an input signal and outputs the inverted signal. The inverters INVs are mutually connected to form a ring shape so as to constitute the ring delay line 21. The clock generation circuit 22 generates the sampling clock CK based on the outputs of the respective delay units (i.e., NAND circuit and inverter INV) that constitute the RDL 21. The sampling clock CK has a period defined by a period data Dp.

The RDL 21 is configured to have the same configuration as the RDL 11 included in the TAD 10. Specifically, the delay unit included in the RDL 21 is designed to have substantially the same delay time characteristics of the delay unit included in the RDL 11. It is noted that the delay time characteristics is delay time variation that depends on the operating voltage and the temperature (i.e., voltage dependency and temperature dependency and). In the RDL 21, as an operating voltage of the delay unit, a constant voltage V_DCO which is set within an allowable voltage range of the input voltage Vin.

As shown in FIG. 4B, the clock generation circuit 22 includes a pulse selector 23 that selects either one output pulse from the delay unit based on the selector value PS and a down counter 24 that performs down-count of a count value which is preset to the number of circular count data values S at rising and falling edges of the output pulse outputted by the first-stage delay unit.

The down counter 24 outputs a countout signal CO that becomes active when the countout occurs and stays active until the sampling clock CK is outputted. The count value is preset to the number of circular count data S when the sampling clock CK is outputted.

The clock generation circuit 22 includes a pulse generation circuit 25, a divider 26, an adder 27 and a latch circuit 28. The pulse generation circuit 25 generates a pulse signal that becomes high for a predetermined period when the output level of the pulse selector 23 changes while the countout signal CO is active and outputs the pulse signal as the sampling clock CK. The predetermined period is set to be shorter than a time necessary for a pulse signal to circulate in the pulse delay circuit. The divider 26 divides the period data Dp by the number of delay units X included in the RDL 21 and outputs the quotient of the division as the number of circular count data S and the remainder as the initial location data R. The adder 27 adds an initial position data R and the selector value PS with a modX (mod represents a residue). The latch circuit 28 latches the output signal of the adder 27 by using the output of the pulse generation circuit 25, i.e., sampling clock CK, and supplies the latched signal as the position data PS to the pulse selector 23.

In other words, the clock generation circuit 22 is configured to output the sampling clock CK having a period T_CK during which the pulse signal circulating in the RDL 21 passes through a plurality of delay units. The number of delay unit of the delay units is represented by the period data Dp.

Figure 5:
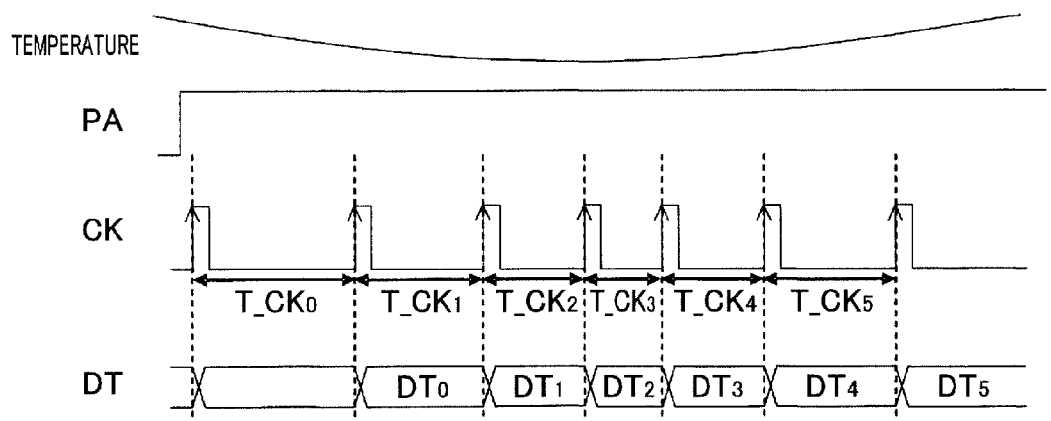
FIG. 5 is a timing diagram showing a sampling clock generated by the DCO and an operation of the analog to digital converter.

FIG. 5 is a timing diagram for explaining an operation of the sampling clock CK generated by the DCO 20 and an operation of the AD converter 1.

The DCO 20 outputs the sampling clock CK of which the period is represented by the period T_CK while the pulse signal PA is high level. When the constant voltage V_DCO is being set as a constant voltage value, assuming a delay time at the delay unit when the ambient temperature is Tm, i.e., delay time DL (TM), the period T_CK is represented by equation (7) as follows.

$$T\_CK = DL \times Dp \quad (7)$$

It is noted that the delay time DL (Tm) varies depending on the temperature, and therefore the period T_CK varies as well. Specifically, as shown in FIG. 5, the lower the temperature, the shorter the period T_CK and the higher the temperature, the longer the period T_CK.

Figure 6:
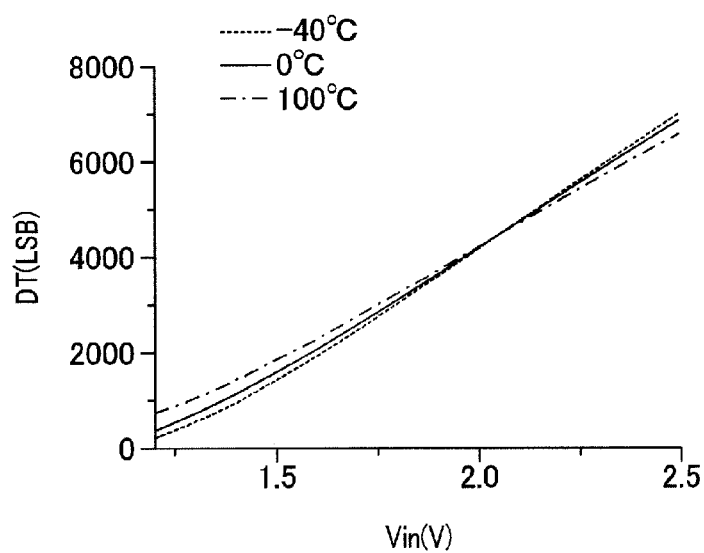
FIG. 6 is a graph showing input-output characteristics of the analog to digital converter.

FIG. 6 is a graph showing conversion characteristics between the input voltage Vin and the AD conversion data DT (i.e., input-output characteristics of the AD converter 1) when the constant voltage V_DCO is set to be 2.0 [V] and the graph provides characteristics when the ambient temperature is −40 deg C., 0 deg C. and 100 deg C.

Since the delay time of the delay unit that constitutes the RDL 11 of the TAD 10 varies depending on the temperature, corresponding to a variation of the delay time, the period of the sampling clock T_CK is changed by an amount of the variation of the delay time.

Therefore, as shown in FIG. 6, in the input-output characteristics of the AD converter 1, the same analog to digital conversion data DT can be obtained regardless of temperature variation when the input voltage Vin equals to the constant voltage V_DCO (that is, the constant voltage VCO becomes the temperature independent voltage Vf) and the analog to digital conversion data fluctuates significantly due to temperature when the input voltage Vin becomes apart from the constant voltage V_DCO.

As described above, as an advantage according to the AD converter 1 of the present disclosure, the temperature independent voltage Vf of the input-output characteristics can be adjusted by setting the constant voltage V_DCO.

Therefore, the constant voltage V_DCO is set so as to control a fluctuation in the conversion data due to temperature variation to be zero at an around center value of a voltage range where the input voltage Vin varies. As a result, fluctuation in the conversion data DT due to temperature variation can be suppressed.

According to the first embodiment, the RDL 11 corresponds to the first pulse delay circuit, configurations other than the RDL 11 of the TAD 10 correspond to the first encoding circuit, the DCO 20 corresponds to the timing generation circuit and the voltage determining circuit, the RDL 21 corresponds to the second pulse delay circuit, the clock generation circuit 22 corresponds to the selector circuit. The pulse signal PA corresponds to the start signal, the sampling clock CK corresponds to the end signal, and the period data Dp corresponds to predetermined number of stages.

Second Embodiment

Figure 7:
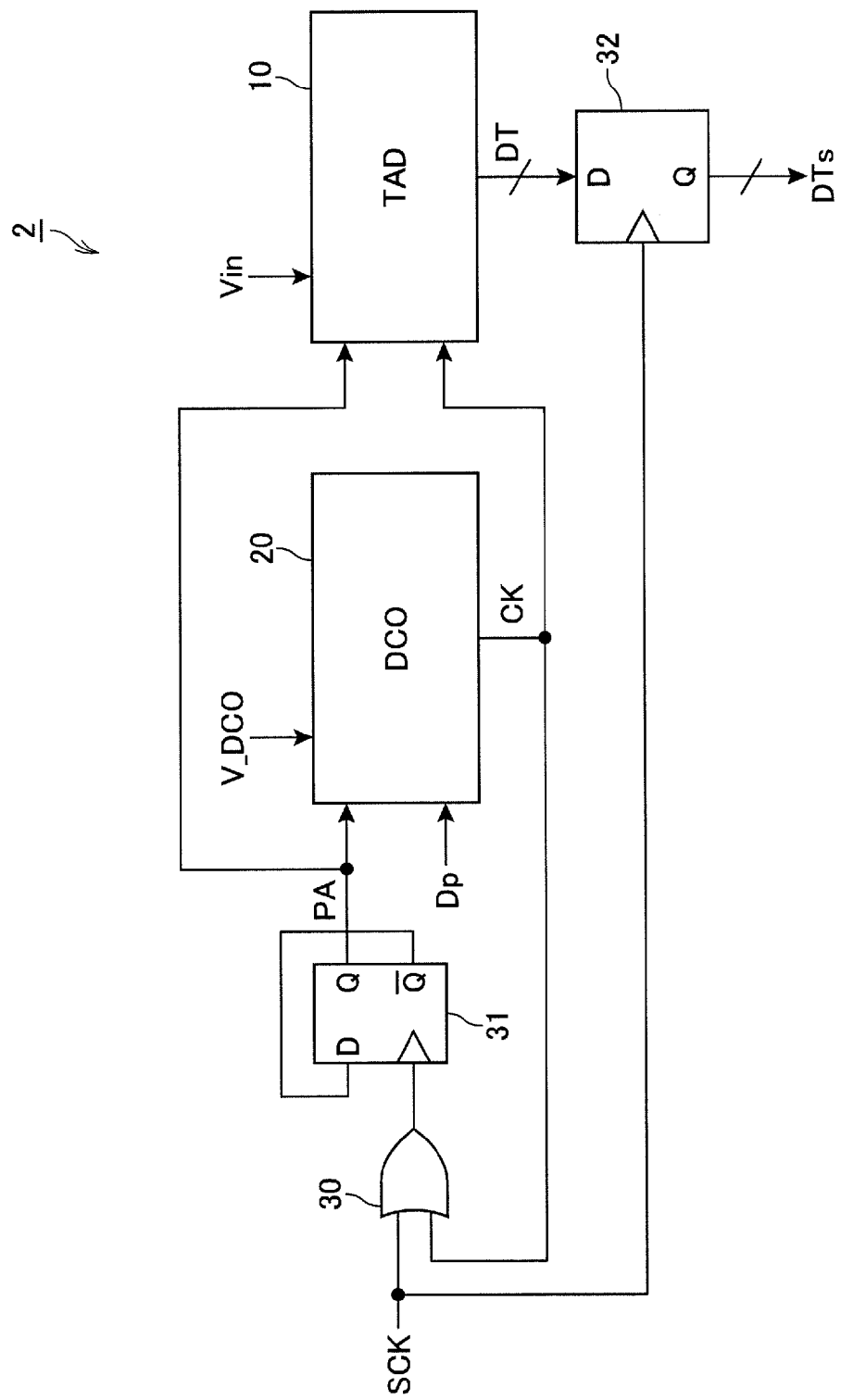
FIG. 7 is a block diagram showing an overall configuration of the analog to digital converter according to the second embodiment.

Next, with reference to FIGS. 7 and 8, a second embodiment is described herein below. FIG. 7 is a block diagram showing an overall configuration of the AD converter 2 according to the second embodiment.

The AD converter 2 is configured to include the TAD 10 and the DCO 20 as well as the AD converter 1 of the first embodiment. In addition, the AD converter 2 includes a logical OR circuit 30, a divider 31 and a latch circuit 32. The logical OR circuit 30 outputs a high level signal when either the input of the system clock SCK supplied externally or the sampling clock CK generated by the DCO 20 is high level. The divider 31 divides the output of the logical OR circuit 30 thereby generating a pulse signal PA that is supplied to the TAD 10 and the DCO 20. The latch circuit 32 latches the analog to digital conversion data DT outputted by the TAD 10 by using the system clock SCK thereby generating the analog to digital conversion data DTs that is synchronized to the system clock SCK.

Regarding the system clock SCK, a crystal oscillator is used for generating the system clock SCK so that the period of the system clock is stable regardless of the temperature variation. The period of the system clock SCK is set to be long enough (e.g. more than 1.5 times longer) for a period T_CK of the sampling clock CK generated by the DCO 20 while the period data Dp is the maximum allowable value and the delay time of the delay unit that constitutes the RDL 21 of the DCO 20 is a maximum value (i.e., under maximum temperature within the guaranteed operating range).

Figure 8:
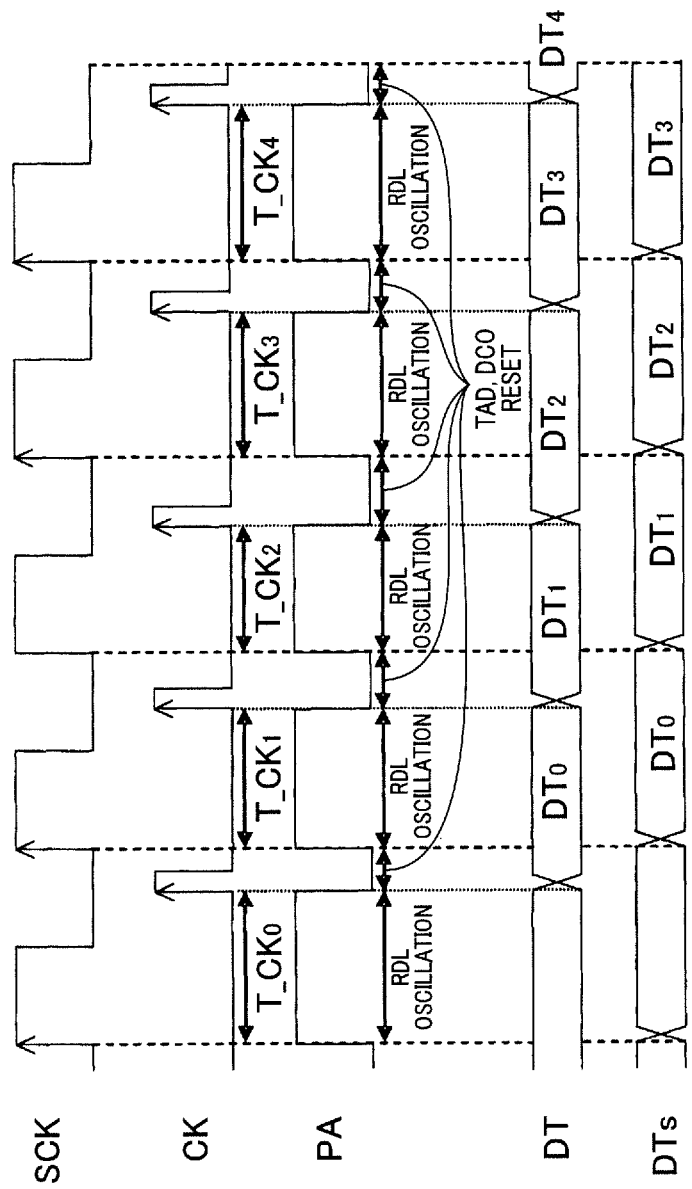
FIG. 8 is a timing diagram showing an operation of the analog to digital converter.

FIG. 8 is a timing diagram showing an operation of an AD converter 2. The period data Dp is set such that the sampling clock CK is outputted after the pulse signal PA rises, to have a high duration being longer than a half period of the system clock SCK and shorter than one period of the system clock SCK.

Thus, the divider 31 generates the pulse signal PA that becomes high level during a period from a rising edge of the system clock SCK to the rising edge of the sampling clock CK, and becomes low level until the rising edge of the system clock SCK occurs.

Since the internal state of the DCO 20 is reset when the pulse signal PA is low level, during a period where the pulse signal PA is being high level (i.e., measurement period of TAD 10) equals the period where the pulse signal passes through the delay units of which the number of units are defined by the period data Dp.

The latch circuit 32 outputs the AD conversion data DTs that is synchronized to the system clock SCK. The AD conversion data DTs is measured at one clock prior to the outputting of the AD conversion data DTs. As described above, according to the AD converter 2, as similar to the AD converters, the temperature independent voltage Vf can be adjusted to any value by using the constant voltage V_DCO. Therefore, by setting the constant voltage V_DCO to be any value, fluctuation in the AD conversion data DT due to temperature variation can be suppressed.

Moreover, in the AD converter 2, the pulse signal PA becomes high level at the rising edge of the system clock SCK (a start timing of the measurement) and then returns to low level at the rising edge of the sampling clock CK (end timing of the measurement). Hence, the internal state of the TAD 10 can be reset at every measurement period so that the AD conversion data is not an accumulated value with an initial value corresponding to the value obtained in the previous measurement period. As a result, the AD conversion data can be obtained in the every measurement period independently.

Third Embodiment

Figure 9:
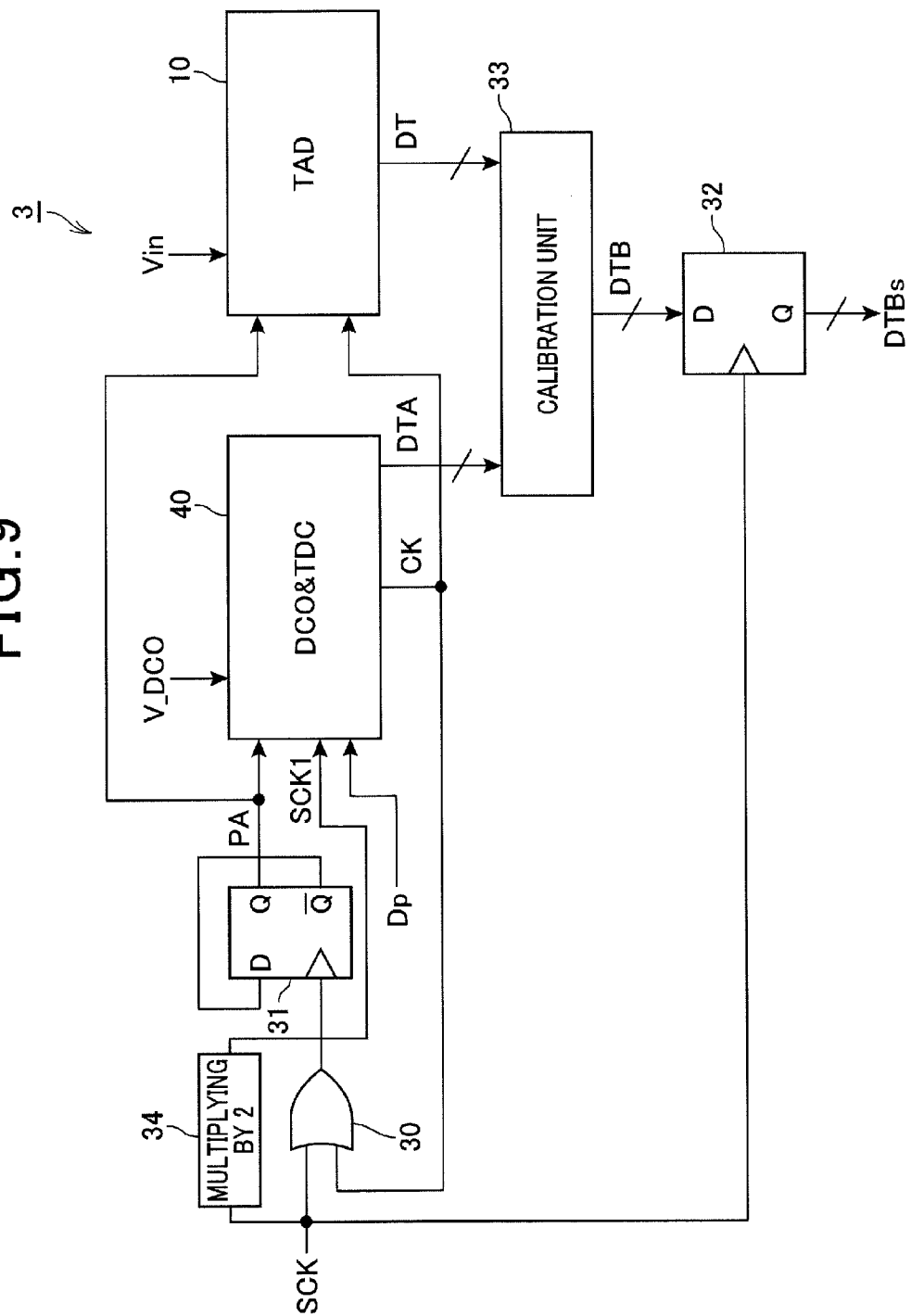
FIG. 9 is a block diagram showing an overall configuration of an analog to digital converter according to the third embodiment.

Next, with reference to FIGS. 9 to 12, 13A and 13B, the third embodiment is described herein below. FIG. 9 is an overall configuration of the AD converter 3 according to the third embodiment.

Regarding the AD converter 3, since only a part of configuration differs from the AD converter 2 of the second embodiment, a configuration that differs from the one of the AD converter 2 is mainly described as below. The AD converter 3 includes TAD 10 which is configured similar to the one of the AD converter 2, a logical OR circuit 30 and a divider 31.

The AD converter 3 includes a DCO & TDC 40 that generates a sampling clock CK and temperature data DTA corresponding to an ambient temperature, instead of the DCO 20 that only generates the sampling clock CK, and a calibration unit 33 that outputs calibrated AD conversion data DTB instead of the latch circuit 32. The calibration unit 33 calibrates the AD conversion data DT outputted by the TAD 10 by using the temperature data DTA outputted by the DCO & TDC 40. The latch circuit 32 latches the AD conversion data DTB outputted by the calibration unit 33 whereby the AD conversion data DTBs synchronized to the system clock SCK is generated.

Figure 10:
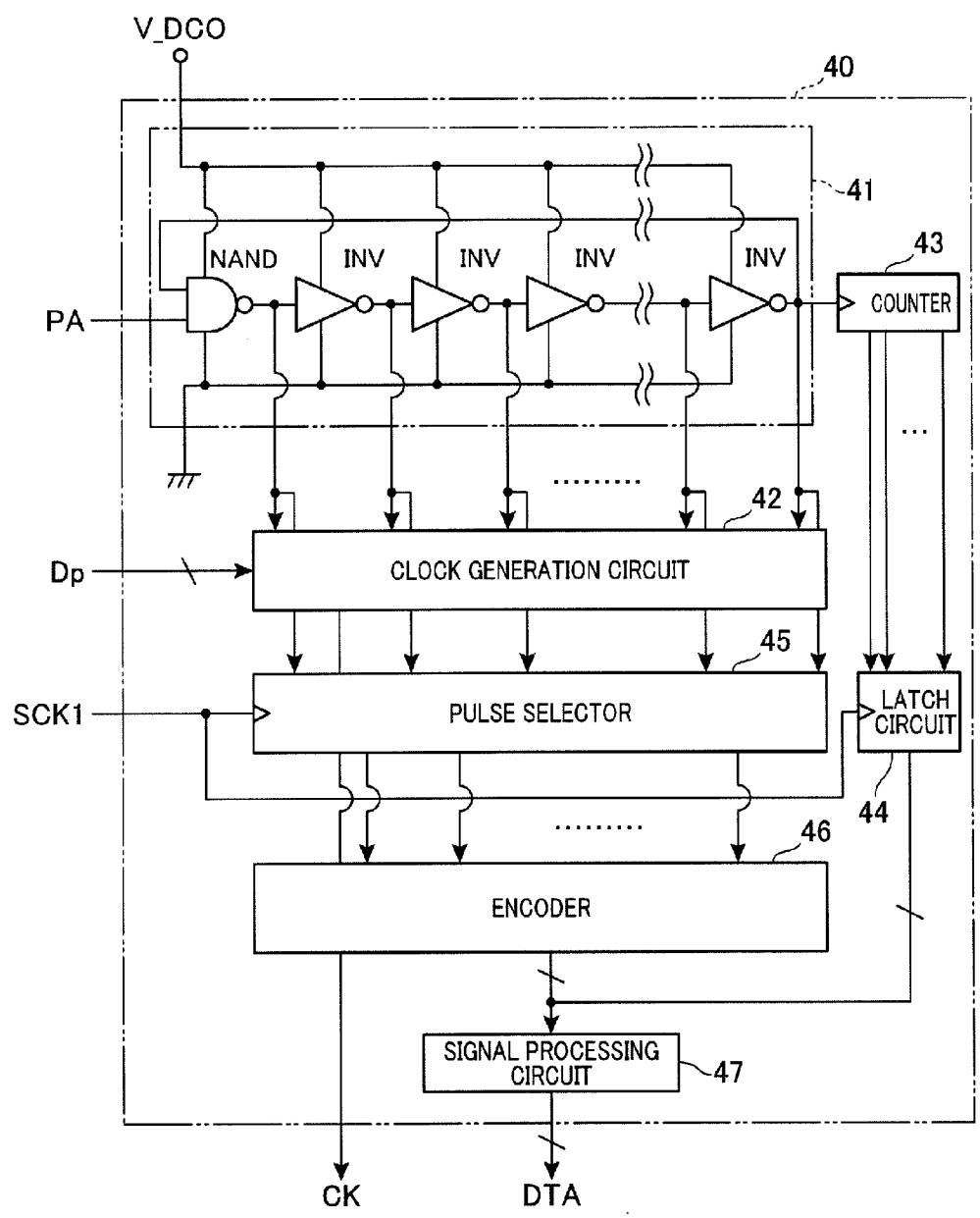
FIG. 10 is a block diagram showing a configuration of a DCO TDC (i.e., time to digital converter)
Figure 11:
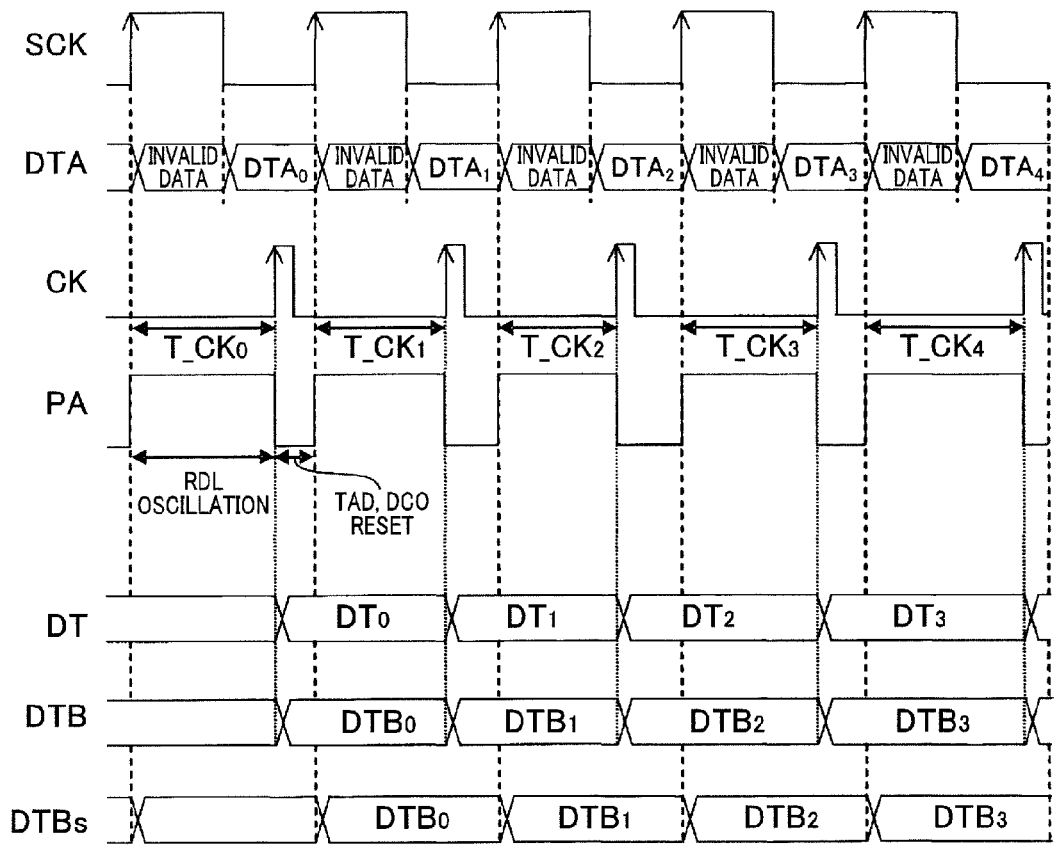
FIG. 11 is a timing diagram showing an operation of the analog to digital converter.

Further, the AD converter 3 includes a clock multiplier 34 that doubles the frequency of the system clock SCK so as to generate a multiplied clock SCK1 and supplies the multiplied clock SCK1 to the DCO &TDC 40. FIG. 10 is a block diagram showing a configuration of the DCO & TDC 40. FIG. 11 is a timing diagram showing operations of the respective parts in the AD converter 3.

As shown in FIG. 10, the DCO & TDC 40 includes a RDL 41 and a clock generation circuit 42 which are configured similar to the RDL 21 included in the DCO 20, and the clock generation circuit 22 respectively. In addition, a counter 43, a latch circuit 44, a pulse selector 45, an encoder 46 and signal processing circuit 47 are configured similar to the counter 12 included in the TAD 10, the latch circuit 13, the pulse selector 14, the encoder 15 and the signal processing circuit 16 respectively.

In the circuit blocks that constitutes the DCO & TDC 40, a circuit block including the RDL 41 and the clock generation circuit 42 (hereinafter is called as DCO block) operates together with the DCO 20 thereby generating the sampling clock CK, and a circuit block other than the clock generating circuit 42 (hereinafter is called as TDC block) operates together with the TAD 10 thereby generating the temperature data DTA.

However, a drive voltage of the RDL 41 that constitutes the TDC block is not the input voltage Vin, but the constant voltage V_DCO. Also, the latch circuit 43 included in the TDC block and the pulse selector 45 operates without the sampling clock CK, but operates with the multiplied clock SCK1. As a result, as shown in FIG. 11, the signal processing circuit 47 outputs the temperature data DTA at every half period of the system clock SCK.

The RDL 41 operates during the high level period (high half period) of the system clock SCK in response to the pulse signal PA, and stop operating during the low level period (low half period) of the system clock SCK at the falling edge of the pulse signal PA. Hence, among the conversion data outputted at half periods of the system clock SCK by the signal processing circuit 47, the conversion data obtained during a measurement period of the high half period of the system clock SCK is used as the temperature data DTA, and the conversion data obtained during a measurement period of the low half period of the system clock SCK is regarded as invalid data.

Unlike the measurement period of the AD conversion data DT, the measurement period of the temperature data DTA becomes constant regardless of the temperature variation (a half period of the system clock SCK, i.e., one period of the multiplied clock SCK1). Accordingly, when the measurement period is constant, the delay time of the delay unit included in the RDL 41 due to temperature variation varies so that the temperature data DTA varies as well.

Figure 12:
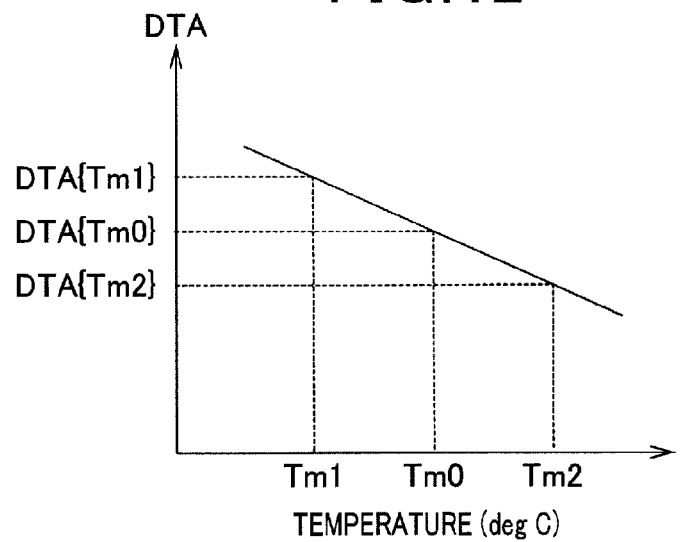
FIG. 12 is a graph showing characteristics of a temperature data DTA.

Specifically as shown in FIG. 12, regarding the temperature data DTA, the larger the temperature, the smaller the temperature data DTA, and the smaller the temperature, the larger the temperature data DTA. Hence, assuming the temperature data DTA when a predetermined reference temperature Tm0 is reference temperature data DTA {Tm0}, by detecting amount of shift of the temperature data from the reference temperature data DTA {Tm0}, the temperature when the temperature data DTA is detected can be estimated.

The calibration unit 33 calculates a calibrated AD conversion data DTB calibrated by using the following equation (8)

$$DTB=(DT-DT\{Vin=Vf\})\times K(TR)+DT\{Vin=Vf\} \qquad (8)$$

where TR=DTA{Tm0}/DTA

Moreover, DT {Vin=Vf} is reference AD conversion data which is AD conversion data obtained when Vin is the temperature independent voltage Vf, K(TR) is an adjustable coefficient which is defined based on a value TR (=DTA {Tm0}/DTA) correlated to the temperature. The DT {Tm0} and the DT {Vin=Vf} are constants. The adjustable coefficient K (TR) is a value being defined by using a predetermined function of TR or a table. As shown in FIG. 12 where characteristics of the temperature data DTA are shown, it is apparent that the TR (i.e., a ratio between the reference temperature data DTA {Tm0} and the measured temperature data DTA) has a correlation with the temperature when the temperature data DTA is measured. The value of the adjustable coefficient K (TR) becomes 1 when TR is 1. When TR is less than 1 (i.e., TR<1), the smaller TR, the larger the adjustable coefficient K (TR), i.e., larger than 1. Similarly, when TR is larger than 1 (i.e., TR>1), the larger TR, the smaller the adjustable coefficient K (TR), i.e., smaller than 1.

Figure 13A:
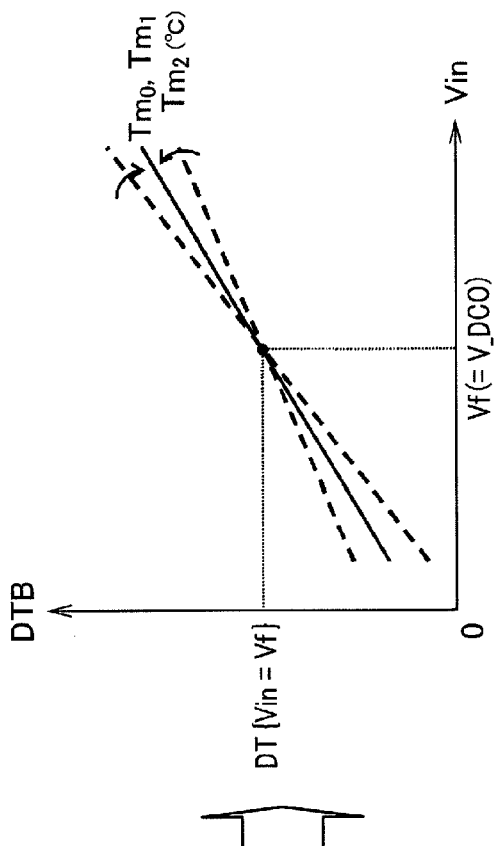
FIGS. 13A and 13B are graphs showing input-output characteristics of the analog to digital converter and an advantages by performing a calibration processing.
Figure 13B:
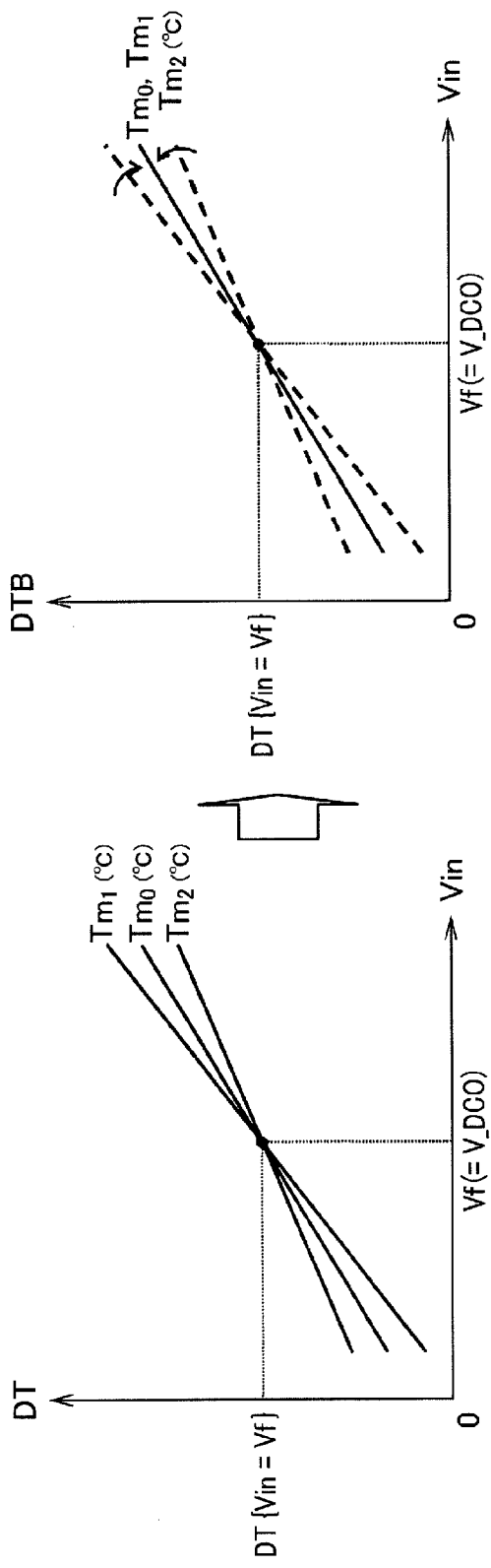

FIGS. 13A and 13B are explanatory diagrams that explain a calibration process executed by the calibration unit 33. That is, for understanding the meaning of the equation (8). FIG. 13A is a graph showing a temperature dependency of the input-output characteristics of the TAD 10 in which the temperature varies among Tm0, Tm1 and Tm2, where Tm1<Tm0<Tm2. FIG. 13B is an explanatory diagram showing advantages of the calibration executed by the calibration unit 33.

As shown in FIG. 13A, the input-output characteristics of the AD converter 3 varie depending on the temperature. However, when the input voltage Vin equals the temperature independent voltage Vf (=V_DCO), the reference AD conversion data DT{Vin=Vf} which is stable regardless of the temperature variation can be obtained. The gradient of the input-output characteristics becomes lower when the temperature becomes higher, and becomes higher when the temperature becomes lower That is, as shown in FIG. 13B, in the equation (8), a difference between the measured AD conversion data and the reference AD conversion data, i.e., (DT−DT{Vin=Vf}) is multiplied by the adjustable coefficient K (TR), whereby the AD conversion data is calibrated to be an AD conversion data obtained when the temperature is the reference temperature Tm0.

As described above, according to the AD converter 3, even if the input voltage Vin significantly differs from the temperature independent voltage Vf (=V_DCO), precise AD conversion data DTB where fluctuation in data due to temperature variation is suppressed can be obtained.

According to the third embodiment, the counter 43, the latch 44, the pulse selector 45, the encoder 46 and the signal processing circuit 47 correspond to the second encoding circuit, the calibration unit 33 corresponds to the calibration circuit. The period of the multiplied clock CK1 corresponds to the fixed period.

Fourth Embodiment

Figure 14:
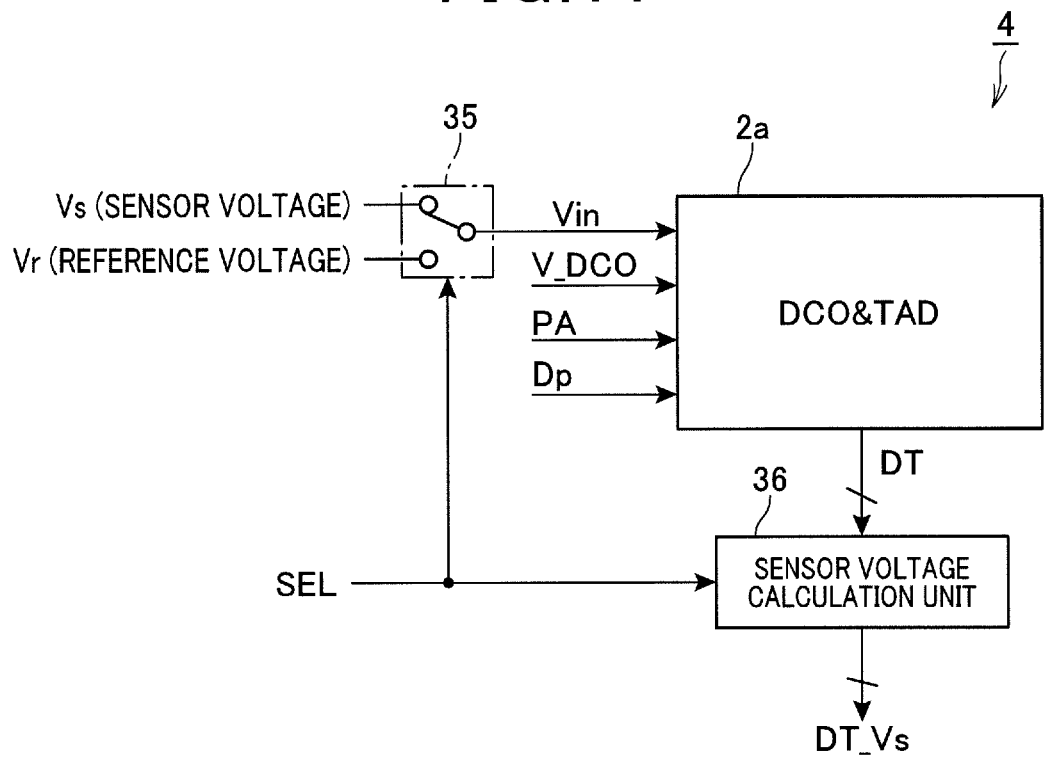
FIG. 14 is an overall configuration of an analog to digital converter according to the fourth embodiment.

Next, with reference to FIGS. 14 and 15, the fourth embodiment is described herein below. FIG. 14 is a block diagram showing an overall configuration of the AD converter 4 according to the fourth embodiment.

The AD converter 4 includes a DCO and TAD 2a, a selector 35 and a sensor voltage calculation unit 36. The DCO & TAD 2a has a configuration where the latch circuit 32 is omitted from the AD converter 2 of the second embodiment. The selector 35 selects, based on the selection signal SEL, either the sensor voltage Vs to be analog to digital converted or the reference voltage Vr which is set different from the constant voltage V_DCO, as an input voltage Vin of the DCO & TAD 2a. The sensor voltage calculation unit 36 calculates the sensor voltage value DT_Vs which is an amount of sensor voltage Vs converted from the AD conversion data DT {Vin=Vs}, by using the AD conversion data DT {Vin=Vs} outputted by the DCO & TAD 2a while the sensor voltage Vs is supplied to the DCO & TAD 2a and the AD conversion data DT {Vin=Vr} outputted by the DCO & TAD 2a while the reference voltage Vr is supplied to the DCO & TAD 2a.

The selector 35 is controlled by the selection signal SEL so as to switch two measurement periods in which a regular measurement period during which the AD conversion data DT {Vin=Vs} concerning the sensor voltage Vs is measured (sampled) by one time or continuously measured (sampled) and a reference voltage measurement period during which the AD conversion data DT {Vin=Vr} concerning the reference voltage Vr is measured by one time or continuously measured are switched alternately.

Regarding the sensor voltage calculation unit 36, the sensor voltage DT_Vs is obtained based on the equation (9).

$$DT\_Vs=(DT\{Vin=Vs\}-DT\{Vin=Vf\})/(DT\{Vin=Vr\}-DT\{Vin=Vf\})\times(Vr-Vf)+Vf \quad (9)$$

Figure 15:
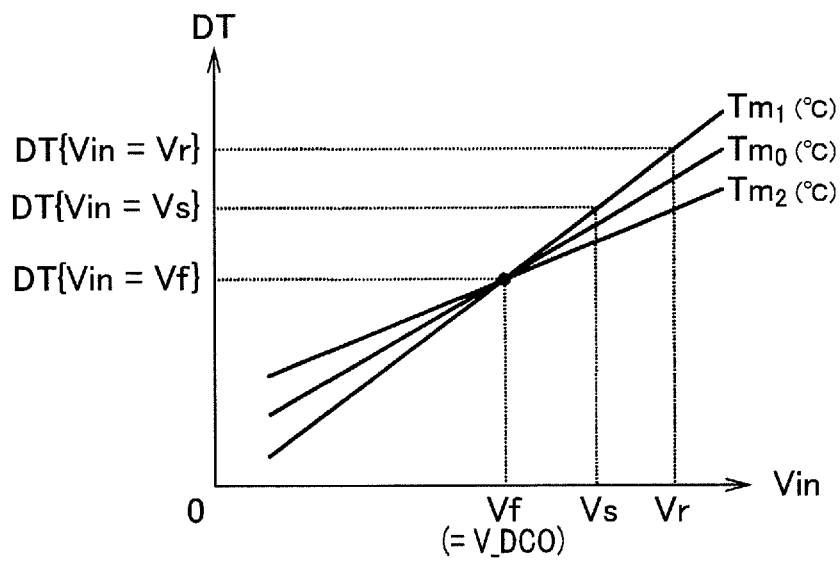
FIG. 15 is an explanatory diagram showing processing executed by the sensor calculating unit.

FIG. 15 is an explanatory diagram for understanding a calculation process executed by the sensor calculation unit 36, that is meaning of the equation (9). Specifically, as similar to FIG. 13A, the FIG. 15 shows how the input-output characteristics of the TAD 10 varies depending on the temperature Tm0, Tm1, Tm2, where Tm1<Tm0<Tm2.

Assuming the temperature at the measurement is Tm1, as shown in FIG. 15, the AD conversion data {Vin=Vs}, DT{Vin=Vr} and the reference AD conversion data DT {Vin=Vf} are on the same input-output characteristics line of the temperature Tm1. Among these three voltages corresponding to the three AD conversion data, the voltages Vf and Vr are already known and only the voltage Vs is unknown. Therefore, when the input-output characteristics is regarded as a linear line, the voltage Vs (sensor voltage valueDT_Vs) can be calculated by the equation (9) which is obtained by using a proportional relationship.

As described above, according to the AD converter 4, without calculating the calibrated AD conversion data DTB, the sensor voltage value DT_Vs can be calculated directly. As a result, the amount of processing required to calculate the sensor voltage value DT_VS can be reduced.

In the fourth embodiment, the selector 35 corresponds to the input selector circuit, the sensor voltage calculation unit 36 corresponds to the voltage calculation circuit and the sensor voltage Vs corresponds to the target voltage.

Fifth Embodiment

Next, the fifth embodiment is described.

Figure 16:
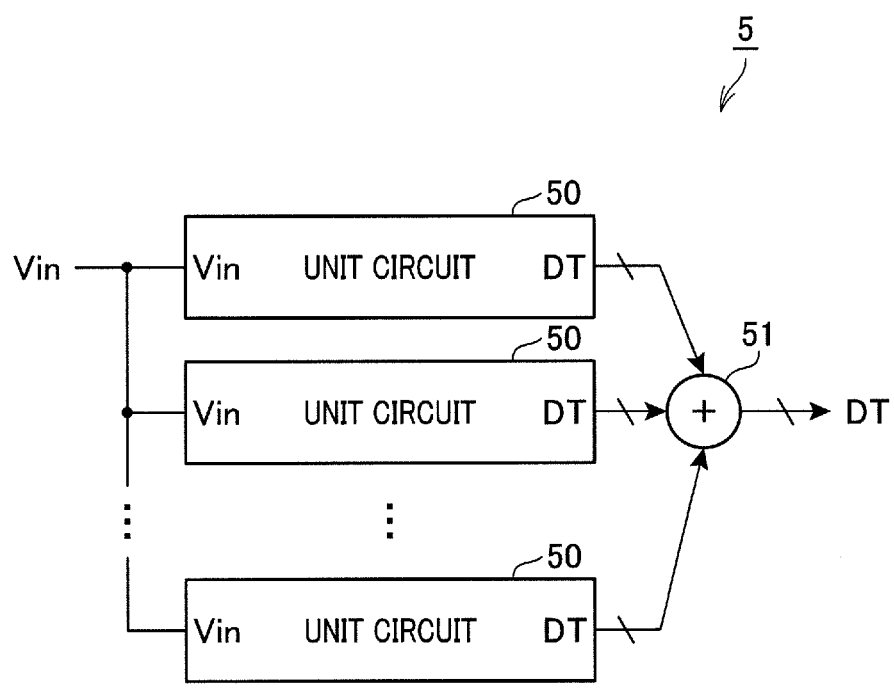
FIG. 16 is a block diagram showing an overall configuration of an analog to digital converter according to the fifth embodiment.

FIG. 16 is a block diagram showing an overall configuration of the AD converter 5 according to the fifth embodiment. The AD converter 5 includes a plurality of unit circuits 50 that perform analog to digital conversion for the same input voltage Vin, and an adder 51 that adds the outputs of the respective unit circuits and generates the AD conversion data DT.

The unit circuit 50 is constituted by any one of AD converters 1 to 4 and the all unit circuits 50 are constituted by identical AD converters. According to the above described AD converter 5, resolution of the AD converter data DT can be enhanced compared to the AD converter that is constituted by single unit circuit 50.

Other Embodiments

As described above, embodiments of the present disclosure are exemplified. The present disclosure is not limited to the aforementioned embodiments, however, and various modifications can be made in the scope of the present invention.

For example, in the AD converter 4 according to the fourth embodiment, the DCO & TAD 2a is constituted by the AD converter 2 that excludes the latch circuit 32. However, the AD converter 4 can be constituted by the AD converter 1 instead.

According to the fifth embodiment, in the AD converter 5, all the unit circuits 50 are constituted by identical AD converters. However, different AD converters can be used for each unit circuit 50. Moreover, when all the unit circuits 50 that constitute the AD converter 5 are constituted by the identical AD converters, the latch circuit 32 (when the unit circuit 50 is AD converter 2 and 3), the calibration unit 33 (when the unit circuit 50 is AD converter 3), the selector 35 and the sensor voltage calculation unit 36 (when the unit circuit 50 is AD converter 4) may be arranged in each unit circuit 50, or these circuits may be shared by the all unit circuits 50. In this case, these circuits can be disposed at the output of the adder 51.

What is claimed is:

1. An analog to digital converter that converts an input voltage to an AD conversion data, the analog to digital converter starting conversion of the input voltage when triggered by a start signal, the analog to digital converter comprising:
a first pulse delay circuit having a plurality of delay units mutually connected to form a multi-stage delay unit, each delay unit included in the multi-stage delay unit having a pulse signal delayed by a delay time corresponding to an input voltage;
a first encoding circuit that detects the number of delay units in the first pulse delay circuit through which the pulse signal passes during a predetermined measurement period, the first encoding circuit outputting the AD conversion data based on the number of delay units detected thereby;
a voltage determining circuit that determines whether or not the input voltage is a specified voltage within an allowable input voltage range; and
a timing generation circuit, in response to receiving the start signal, generates an end signal when the voltage determining circuit detects the input voltage is a specified voltage within an allowable input voltage range, the timing generation circuit determining the predetermined measurement period to be a time required for the pulse signal to pass through a predetermined number of the delay units which is specified in advance.

2. The analog to digital converter according to claim 1, wherein the timing generation circuit includes:
a second pulse delay circuit having a plurality of delay units mutually connected to form a multi-stage delay unit,
each delay unit included in the multi-stage delay unit having a pulse signal delayed by a delay time responding to the specified voltage, and each delay unit having substantially the same temperature dependency as the delay unit included in the first pulse delay circuit;
a selector circuit that selects an output of a delay unit where the pulse signal has passed through the number of delay units specified in advance, and outputs the output of the delay unit as the end signal.

3. The analog to digital converter according to claim 2, wherein the analog to digital converter includes:
a second encoding circuit that detects the number of delay units in the second pulse delay circuit through which the pulse signal passes during a predetermined fixed period, the second encoding circuit outputting temperature data that correlates to a temperature, based on the number of delay units detected thereby; and
a calibration circuit that calibrates the AD conversion data outputted by the first encoding circuit, wherein the calibration circuit calibrates the AD conversion data by using the temperature data outputted by the second encoding circuit, predetermined reference temperature data which is a temperature data outputted by the second encoding circuit when the temperature is a predetermined reference temperature and predetermined reference AD conversion data which is AD conversion data outputted by the first encoding circuit when the input voltage is the specified voltage, to be a value outputted when the temperature is the reference temperature.

4. The analog to digital converter according to claim 1, wherein the analog to digital converter includes:
an input selector circuit that selects alternately either a target voltage to be converted or a reference voltage different from the specified voltage, and supplies the first pulse delay circuit with a voltage selected by the input selector circuit as an input voltage;
a voltage calculation circuit that calculates the target voltage by using predetermined reference AD conversion data which is AD conversion data outputted by the first encoding circuit when the input voltage is the specified voltage, and AD conversion data outputted by the first encoding circuit when the target voltage is supplied to the first encoding circuit by the input selector circuit, the AD conversion data outputted by the first encoding circuit when the reference voltage is set to be the specified voltage.

5. The analog to digital converter according to claim 2, wherein the analog to digital converter includes:
an input selector circuit that selects alternately either a target voltage to be converted or a reference voltage to be different from the specified voltage, and supplies the first pulse delay circuit with a voltage selected by the input selector circuit as an input voltage;
a voltage calculation circuit that calculates the target voltage by using predetermined reference AD conversion data which is AD conversion data outputted by the first encoding circuit when the input voltage is the specified voltage, the AD conversion data outputted by the first encoding circuit when the target voltage is supplied to the first encoding circuit by the input selector circuit, the AD conversion data outputted by the first encoding circuit when the reference voltage is set to be the specified voltage.

6. An analog to digital converter comprising:
a plurality of unit circuits, each unit circuit being configured by the AD converter according to claim 1; and
an adder that adds outputs of the plurality of unit circuits, wherein the analog to digital converter outputs an output of the adder as AD conversion data.

7. An analog to digital converter comprising:
a plurality of unit circuits, each unit circuit being configured by the AD converter according to claim 2; and
an adder that adds outputs of the plurality of unit circuits, wherein the analog to digital converter outputs an output of the adder as AD conversion data.

8. An analog to digital converter comprising:
a plurality of unit circuits, each unit circuit being configured by the AD converter according to claim 3; and
an adder that adds outputs of the plurality of unit circuits, wherein the analog to digital converter outputs an output of the adder as AD conversion data.

9. An analog to digital converter comprising:
a plurality of unit circuits, each unit circuit being configured by the AD converter according to claim 4; and
an adder that adds outputs of the plurality of unit circuits, wherein the analog to digital converter outputs an output of the adder as AD conversion data.

* * * * *